(12) United States Patent
Weaver, Jr. et al.

(10) Patent No.: US 7,717,591 B2
(45) Date of Patent: *May 18, 2010

(54) INCORPORATING REFLECTIVE LAYERS INTO LED SYSTEMS AND/OR COMPONENTS

(75) Inventors: Stanton E. Weaver, Jr., Northville, NY (US); James Reginelli, Parma, OH (US)

(73) Assignee: Lumination LLC, Cleveland, OH (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/965,686

(22) Filed: Dec. 27, 2007

(65) Prior Publication Data

US 2009/0166653 A1 Jul. 2, 2009

(51) Int. Cl.
*F21V 1/00* (2006.01)
*F21V 7/00* (2006.01)
*F21V 11/00* (2006.01)

(52) U.S. Cl. .................. 362/341; 362/317; 362/235; 362/241

(58) Field of Classification Search .......... 362/600, 362/642, 624, 230, 231, 317, 341, 800
See application file for complete search history.

(56) References Cited

U.S. PATENT DOCUMENTS

| 5,838,406 | A | 11/1998 | McGregor et al. |
| 6,885,033 | B2 | 4/2005 | Andrews |
| 6,891,588 | B2 | 5/2005 | Kawachi et al. |
| 7,025,464 | B2 * | 4/2006 | Beeson et al. ............. 353/98 |
| 7,201,497 | B2 * | 4/2007 | Weaver et al. ......... 362/296.03 |
| 7,431,479 | B2 * | 10/2008 | Weaver et al. ......... 362/296.07 |
| 2004/0080939 | A1 * | 4/2004 | Braddell et al. ........... 362/240 |
| 2006/0012991 | A1 | 1/2006 | Weaver, Jr. et al. |
| 2006/0215422 | A1 * | 9/2006 | Laizure et al. ............ 362/650 |
| 2007/0047261 | A1 * | 3/2007 | Thompson et al. ........ 362/623 |
| 2007/0086211 | A1 * | 4/2007 | Beeson et al. ............ 362/628 |
| 2008/0074871 | A1 * | 3/2008 | Meis et al. ................ 362/218 |

OTHER PUBLICATIONS

W.L. Gore & Associates—Electronic Products Division; GORE® DRP® Diffuse Reflectors; 1999.

* cited by examiner

*Primary Examiner*—Jacob Y Choi
(74) *Attorney, Agent, or Firm*—Fay Sharpe LLP

(57) ABSTRACT

A light emitting apparatus includes a support having circuitry disposed thereon, at least one light emitting diode (LED) chip mounted on the support and in electrical communication with the circuitry and a reflective layer on the support adjacent the at least one chip.

16 Claims, 4 Drawing Sheets

INCORPORATING REFLECTIVE LAYERS INTO LED SYSTEMS AND/OR COMPONENTS

BACKGROUND

The present invention relates to the lighting arts. It especially relates to high intensity light emitting diode packages, components, apparatuses, and so forth, and will be described with particular reference thereto. However, the invention will also find application in conjunction with other solid state light emitters such as vertical cavity surface emitting lasers.

High brightness light emitting packages typically employ a plurality of light emitting diode chips, surface emitting laser chips, organic light emitter chips, or the like. To mechanically support the chips and to electrically interconnect the chips, in some light emitting packages the light emitting chips are disposed on a printed circuit board. The printed circuit board can also support and electrically incorporate discrete electronic components, application-specific integrated circuits (ASICs), programmable microprocessors, or the like, for providing input power conditioning, light output control, electrostatic discharge protection, or other functions.

Disadvantageously, the printed circuit board can contribute to optical losses by partially absorbing light that impinges upon the printed circuit board. Printed circuit boards typically include a topmost epoxy solder mask layer having lithographically defined openings through which the light emitting chips or other electronic components electrically contact bonding pads of the printed circuitry. In conventional printed circuit boards for electronic applications, the solder mask layer is not optimized for its optical properties, and is thus not very reflective.

For high brightness light emitting packages, printed circuit boards having a commercially available white solder mask are sometimes used. These white solder masks contain white talc or another white material that reflects visible light. White solder masks provide a substantial improvement in reflectance of visible light over conventional blue or green solder masks.

White solder masks have certain disadvantages for some high brightness light emitting packages. While the white solder mask appears to be highly reflective, it has been found that the reflectance of such boards is only about 80% or less in the visible spectral region. If 50% of the visible light produced by the light emitting package impinges on the printed circuit board, this reflectance corresponds to optical losses of around 10% or higher due to absorption in the printed circuit board.

Moreover, the reflectance of the white solder masks decreases in the blue, violet, and ultraviolet spectral regions. It has been found that the white solder board reflectance decreases below 60% for wavelengths less than about 410 nm. In certain light emitting packages, wide-bandgap light emitting chips emitting blue, violet, or ultraviolet light emission are coupled with a phosphor that converts the light emission into white or another selected visible light. In such packages, a substantial amount of blue, violet, or ultraviolet light typically reflects from the phosphor toward the printed circuit board. The relatively low reflectance of white solder masks for blue, violet, or ultraviolet wavelength light degrades the light output efficiency of these packages.

White solder masks have been constructed to have a reflectance of about 85% between about 400 nanometers and about 740 nanometers. These white solder masks have been formed of a film of photostabilized electrically insulating binder material, such as a photosensitive epoxy, a photosensitive polyimide, or so forth, in which particles of a reflective filler material are dispersed. The particles used for the reflective filler material include a titanium dioxide, $TiO_2$, alumina, $Al_2O_3$, and a high-refractive index glass.

Another known material used as a solder mask is formed of a multiple-layer specular reflector sheet. Openings are cut into the sheet to define the vias, and the multiple-layer specular reflector sheet is glued or otherwise secured to the electrically insulating board. This reflector sheet includes a stack of reflective dielectric layers including alternating layers of dielectric material having different refractive indices, different birefringence characteristics, or other dissimilar optical characteristics. The thicknesses and optical characteristics of the layers has been selected to provide a high stack reflectance in the wavelength range between about 400 nanometers and about 470 nanometers, and preferably in the wavelength range between about 400 nanometers and about 740 nanometers. The multiple-layer specular reflector sheet that has been described is a commercially available reflector sheet, such as a VM2000 reflector film or a Vikuiti™ enhanced specular reflector film (available from 3M, St. Paul, Minn.). Solder masks formed of VM2000 or Vikuiti™ enhanced specular reflector films have been measured to have reflectances greater than 85% between 400 nanometers and 740 nanometers.

An approach for achieving high reflectances in the blue, violet, or ultraviolet would be to use a metallic reflector. However, incorporating a metallic reflector, which is generally electrically conductive, into a solder mask is problematic since the solder mask is in contact with or in proximity to the printed circuitry and electronic component leads.

BRIEF SUMMARY

A light emitting apparatus that overcomes the aforementioned shortcomings is disclosed. The apparatus includes a support having circuitry disposed thereon, at least one light emitting diode (LED) chip mounted on the support and in electrical communication with the circuitry and a reflective layer on the support adjacent the at least one chip. In this embodiment, the reflective layer includes polytetrafluoroethylene (PTFE), which provides for a highly reflective surface for any light that is reflected back towards the support.

A light emitting apparatus that overcomes the aforementioned shortcomings can also include one or more light emitting chips, a printed circuit board on which the one or more light emitting chips are disposed and a reflective film on a solder mask of the printed circuit board. The printed circuit board can include an electrically insulating board, electrically conductive printed circuitry, and an electrically insulating solder mask having vias through which the one or more light emitting chips electrically contact the printed circuitry. The reflective film can include openings that align with respective vias in the solder mask through which the one or more light emitting chips electrically contact the printed circuitry. The reflective film has a reflectance of greater than about 90% at least between about 400 nanometers and about 750 nanometers.

A method for fabricating a light emitting apparatus that overcomes the aforementioned shortcomings can include the following steps: providing an electrically insulating board with electrically conductive printed circuitry disposed thereon; disposing an electrically insulating solder mask on the electrically insulating board leaving exposed at least a portion of the printed circuitry; disposing one or more light emitting chips on the insulating solder mask, the one or more light emitting chips electrically contacting the exposed printed circuitry; and disposing a reflective layer on the insulating solder mask around the one or more light emitting chips, the reflective layer having a reflectance of greater than about 90% at least between about 400 nanometers and about 470 nanometers.

Numerous advantages and benefits of the present invention will become apparent to those of ordinary skill in the art upon reading and understanding the present specification.

BRIEF DESCRIPTION OF THE DRAWINGS

The invention may take form in various components and arrangements of components, and in various process operations and arrangements of process operations. The drawings are only for purposes of illustrating preferred embodiments and are not to be construed as limiting the invention. In the drawings, layer thicknesses, coating thicknesses, and other dimensions are not drawn to scale.

In FIG. 1, one sidewall of the housing is removed to reveal internal components of the light emitting package.

DETAILED DESCRIPTION

Figure 1:
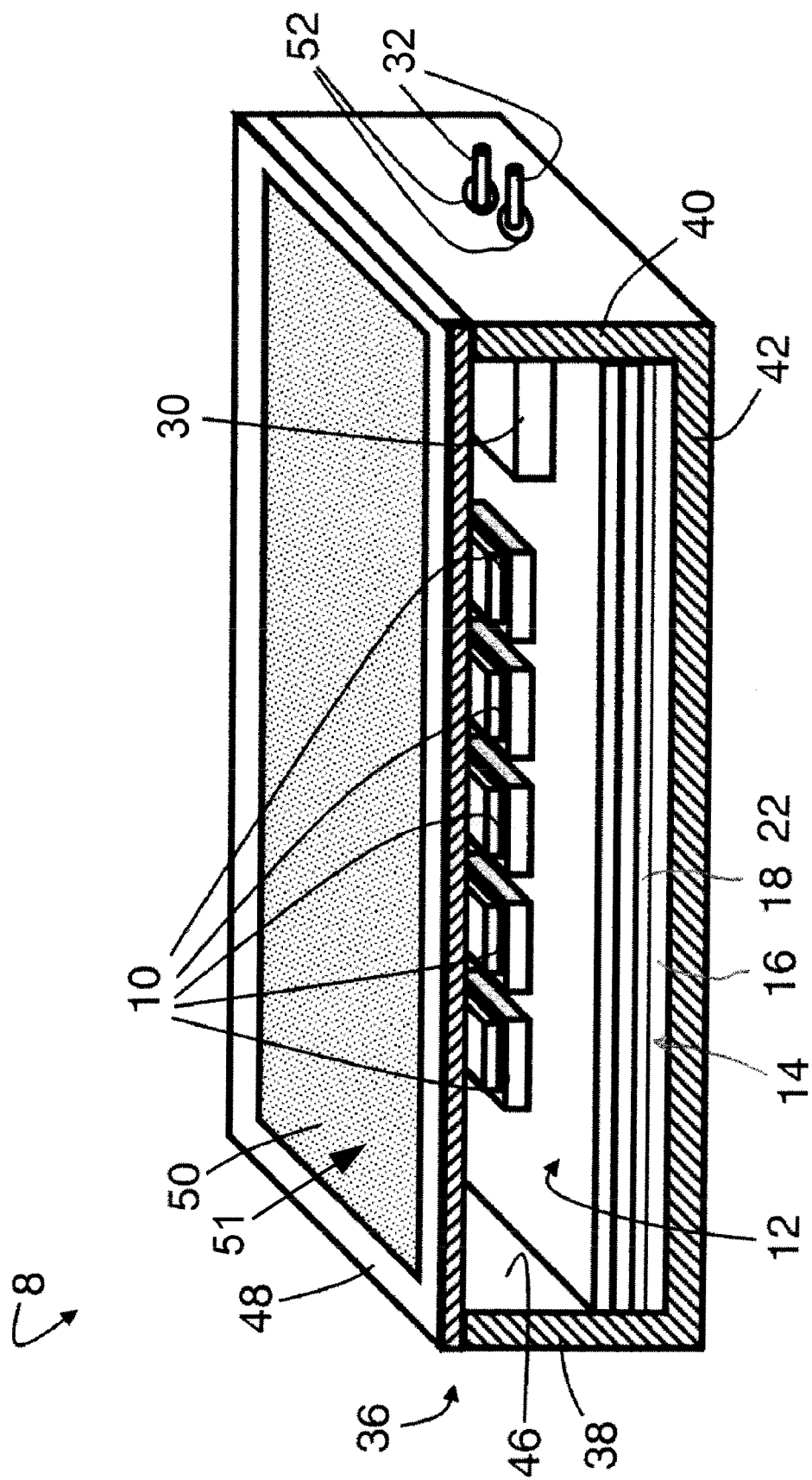
FIG. 1 shows a perspective view of a light emitting package.
Figure 2:
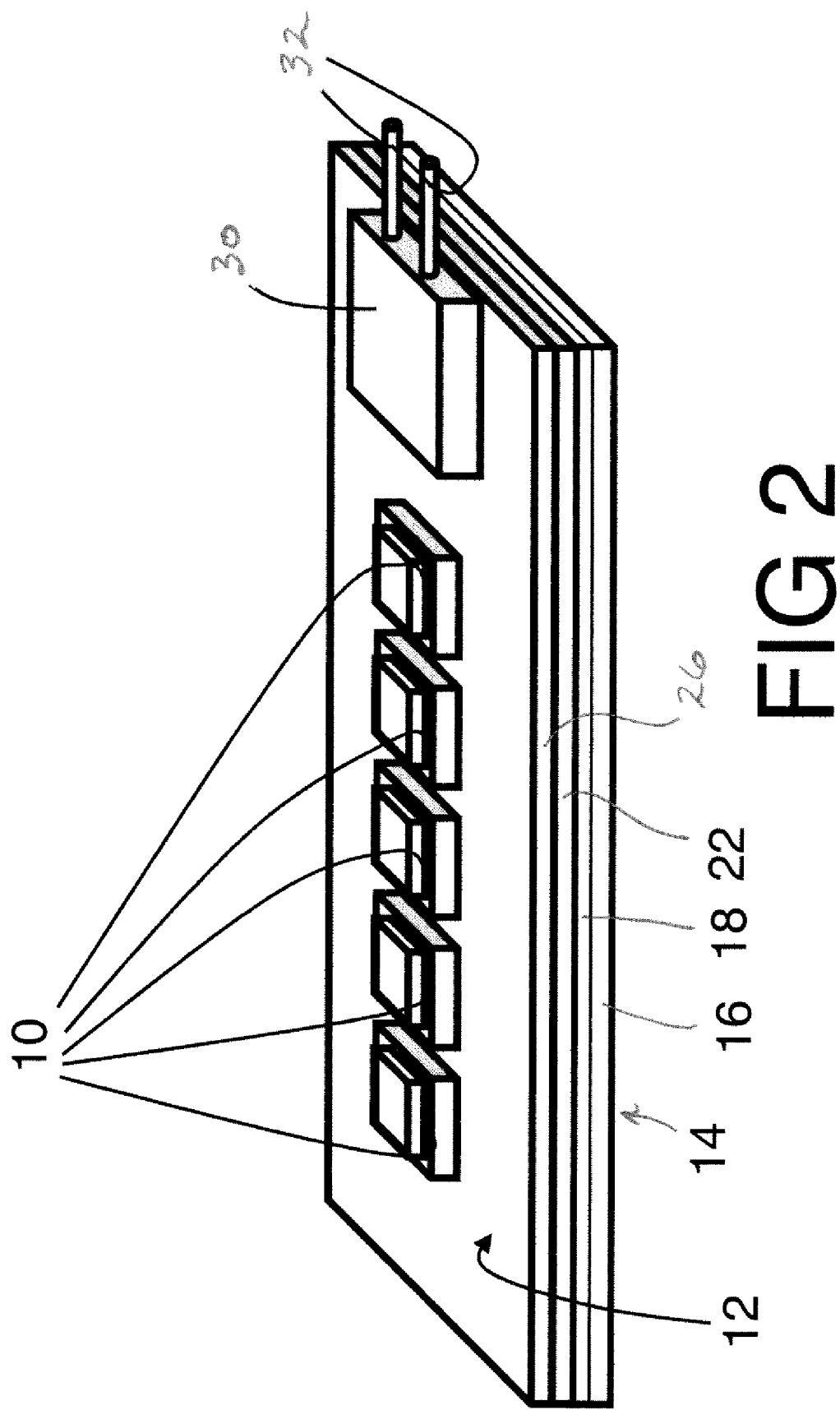
FIG. 2 shows a perspective view of the printed circuit board and electronic components of the package of FIG. 1.
Figure 3:
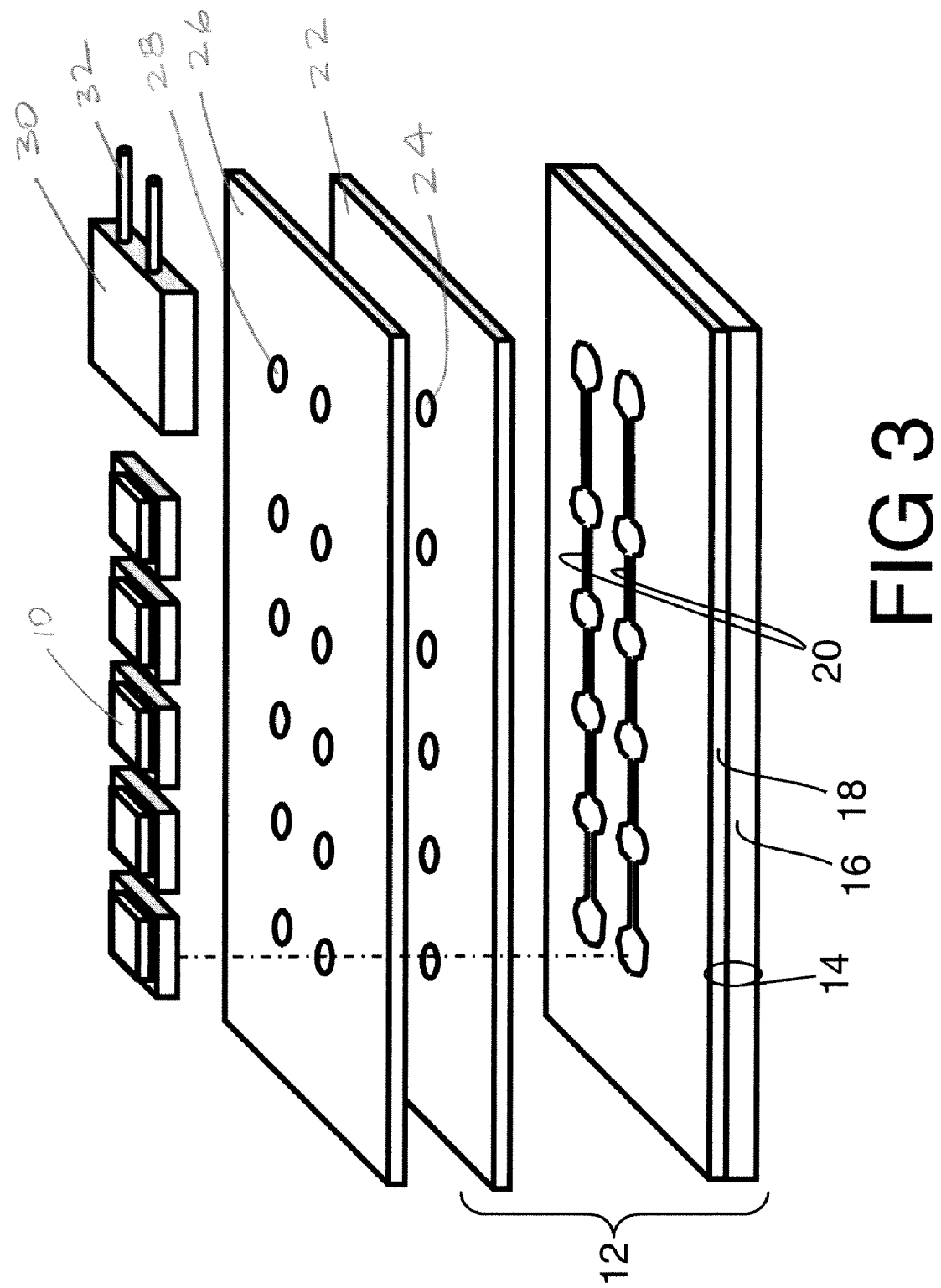
FIG. 3 shows an exploded perspective view of the printed circuit board and electronic components of the package of FIG. 1.

With reference to FIGS. 1-3, a light emitting apparatus 8 includes a plurality of light emitting chips 10 disposed on a support, which in the depicted embodiment is a printed circuit board 12. The illustrated printed circuit board 12 includes an electrically insulating board 14, which in the illustrated embodiment includes a conductive metal core 16 and an insulating layer 18 made of a fiberglass resin or another electrically insulating material. In some embodiments, the conductive metal core 16 is omitted: for example, the electrically insulating board may be a fiberglass resin board without a metal core. Electrically conductive printed circuitry 20 (shown in FIG. 3) is disposed on the insulating layer 18 of the insulating board 14. A solder mask 22 is disposed on the insulating board 16 and includes openings or vias 24 (shown in FIG. 3) through which the light emitting chips 10 electrically contact the printed circuitry 20. A highly reflective layer 26, which can be a highly reflective film, is disposed on the solder mask 22 and includes openings 28 that align with the vias 24 (shown in FIG. 3) through which the light emitting chips 10 electrically contact the printed circuitry 20. Optionally, one or more additional electronic components, such as the example electronic component 30, are also disposed on the printed circuit board 12 and electrically contact the printed circuitry 20 by the openings or vias 24 and 28.

In the illustrated example, an electronic component 30 receives electrical power through contact pins 32 and rectifies, converts, or otherwise conditions the received electrical power to produce operating power delivered to the printed circuitry 20 to operate the light emitting chips 10. Optionally, the electronic component 30 or another electronic component can provide electrostatic discharge protection, selectable switching, or the like. The electronic component 30 can be embodied as an application-specific integrated circuit (ASIC), a programmed microcontroller or microprocessor, or the like. Alternatively or additionally, electronic components can be embodied by discrete components such as resistors, inductors, capacitors, op-amps, digital logic gates, or the like which are interconnected by the printed circuitry to perform power conditioning, switching, a light dimming function, or so forth.

In the illustrated embodiment, the electrically insulating board 14 of the printed circuit board 12 is a metal core board that includes the planar conductive metal core 16, such as an aluminum plate, copper foil, or the like, along with the insulating layer 18. The insulating layer 18 can be, for example, a fiberglass resin sheet or coating, which electrically isolates the printed circuitry 20 from the metal core 16. Optionally, the printed circuitry 20 electrically contacts the metal core 16 at selected points through vias (not shown) formed in the insulating layer 18, such that the metal core 16 acts as a ground plate for the printed circuitry 20. The metal core 16 also spreads and/or dissipates heat generated by the light emitting chips 10 and the one or more electronic components 26.

The light emitting chips 10, the one or more electronic components 26, and the printed circuit board 12 are housed in a housing 36 (shown in FIG. 1). The housing 36 includes sidewalls 38, 40 and a bottom 42 on which the printed circuit board 12 is disposed. (One sidewall is omitted in FIG. 1 to reveal the internal components of the light emitting package 10; a second sidewall is disposed opposite the removed sidewall and is not visible in the perspective view of FIG. 1). The sidewalls 38, 40 can have reflective interior surfaces 46. For example, the sidewalls 38, 40 and bottom 42 can define a rectangular metal box which, in addition to providing reflective interior surfaces 46, also provides a thermal heat sink for the example metal core printed circuit board 12. A top 48 of the housing 36 faces the light emitting chips 10 includes a light-transmissive plate 50. The light-transmissive plate 50 and the reflective interior surfaces 46 can individually or collectively, make up an optical component that is disposed in relation to the printed circuit board 12 and the light emitting chips 10 such that when the chips are energized to emit light, light is reflected by the optical component back towards the reflective layer 26.

In operation, the light emitting chips 10 can emit blue, violet, or ultraviolet light predominantly in a wavelength range between about 400 nanometers and about 470 nanometers. In one embodiment, the emitted blue, violet, or ultraviolet light irradiates the plate 50, which can include a phosphor. A phosphor 51 disposed on or dispersed in the plate 50 emits fluorescence or phosphorescence predominantly in a wavelength range above 470 nanometers responsive to the blue, violet, or ultraviolet irradiation. The plate 50 is light-transmissive for the fluorescence or phosphorescence so that the light emitting package 8 outputs light due to the fluorescence or phosphorescence.

In some embodiments, the phosphor includes one or more constituents that produce a white fluorescence or phosphorescence. In other embodiments the phosphor includes one or more constituents that produce fluorescence or phosphorescence of a selected color or blend of colors. Optionally, the plate 50 is also light-transmissive for the blue, violet, or ultraviolet irradiation produced by the light emitting chips 10, so that the light output of the light emitting package 8 is a combination of the fluorescence or phosphorescence output by the phosphor and direct light output by the light emitting chips 10. For example, in some embodiments the light emitting chips 10 produce blue emission light and the phosphor produces yellow light, so that the blended direct and phosphor-generated light combine in the output of the light emitting package 8 to approximate white light. The reflective interior surfaces 46 of the sidewalls 38, 40 reflect light produced by the light emitting chips 10 that impinges on the sidewalls 38, 40 toward the plate 50 to improve light extraction efficiency. In yet another embodiment, the plate 50 can include no phosphor and act as a diffuser. In another embodiment, the light emitting diode chips can emit light of different colors that are mixed. For example, a first chip can emit light of a first color and a second chip, or other chips, can emit light of a second color.

In the illustrated embodiment, the sidewall 40 includes electrically insulated feedthrough openings 52 through which the contact pins 30 of the electronic component 26 pass to enable connection of an electrical power source to the light emitting package 8. Other power input configurations can also be used, such as a female power receptacle, a hard-wired electrical power cable, or the like. Optionally, a battery (not shown) is included in the light emitting package so that no external power supply is needed.

It will be appreciated that the housing 36 is only an example. The housing can have other shapes besides rectangular, can include phosphorized sidewalls in addition to or in place of a phosphorized top, or can include other modifications. In some embodiments, the housing includes a phosphorized dome arranged over the light emitting chips. The light emitting package 8 can also include additional or other components, such as a heat sink, heat radiating fins, a lens or other optical component or components optically coupled with the plate 50, Tensing for focusing the light emitting chip emission onto a phosphorized window or region, or so forth.

Figure 5:
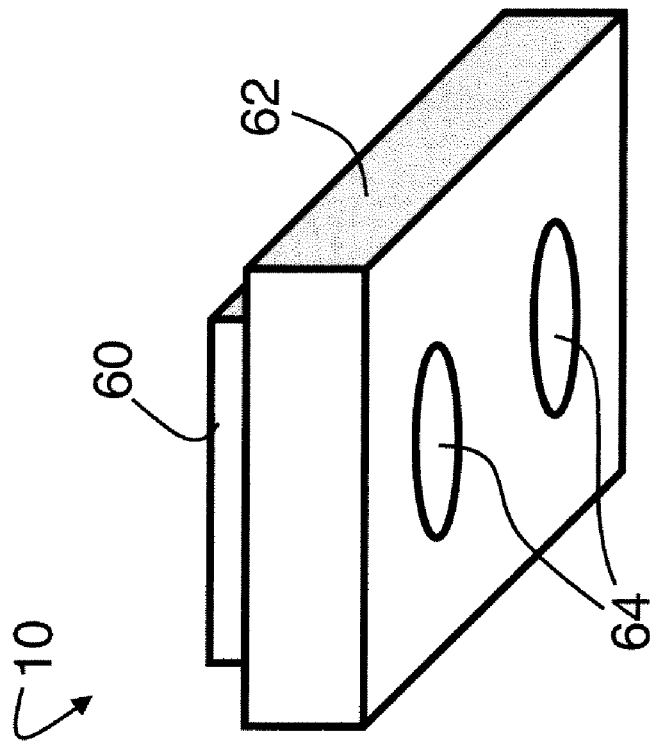
FIGS. 4 and 5 show perspective views of one of the light emitting chips of the package of FIG. 1 from two different vantage points.
Figure 4:
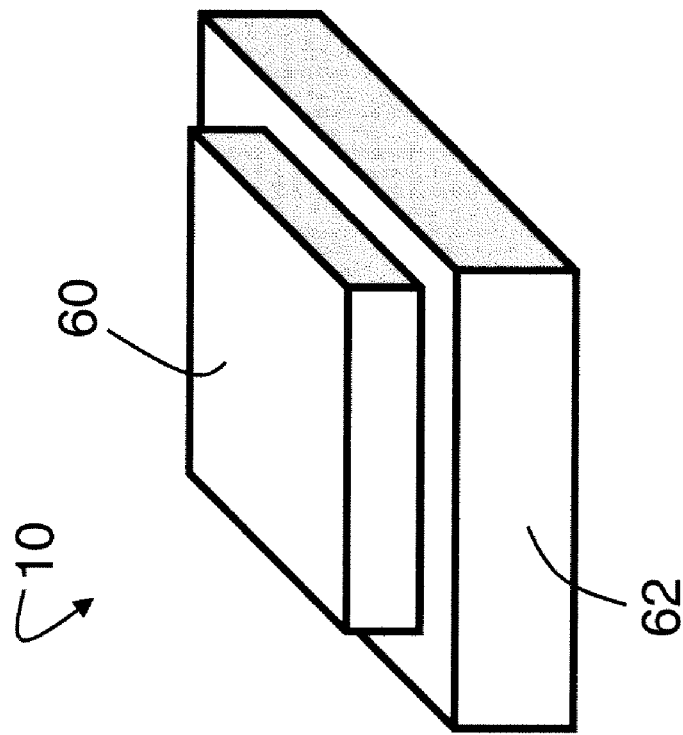

With continuing reference to FIGS. 1-3 and with further reference to FIGS. 4 and 5, each light emitting chip 10 can be a light emitting diode, a vertical cavity surface emitting laser (VCSEL), a monolithic array of light emitting diodes or lasers, an organic light emitting chip, or the like. In the illustrated embodiment, each light emitting chip 10 includes a semiconductor chip 60 flip-chip bonded to a sub-mount 62. The sub-mount 62 includes electrical vias electrically connecting the semiconductor chip 60 with backside bonding pads 64. The illustrated light emitting chip 10 is only an example; in other embodiments the light emitting chip may be direct-bonded to the printed circuit board 12 without a sub-mount, or may be bonded to a sub-mount but electrically contacted to the printed circuit board using wire bonds, or may be flip-chip bonded to bonding pads of a sub-mount which sub-mount bonding pads are electrically connected with the printed circuit board 12 by wire bonds, or so forth.

In some embodiments, the light emitting chips are group III-nitride based light emitting diodes or lasers emitting light predominantly in a wavelength range between about 400 nanometers and about 470 nanometers. Other blue, violet, or ultraviolet light emitting chips can be employed which emit light predominantly in a wavelength range between about 400 nanometers and about 470 nanometers. Moreover, other light emitting chips that emit light other than blue, violet, or ultraviolet light can also be employed.

In some embodiments, the electrical connections of the light emitting chips 10 to the printed circuit board 12 are produced by soldering. The solder mask 22 keeps the solder in the areas of the vias 24. In other embodiments, thermosonic bonding, thermocompressive bonding, or another bonding technique is used. Regardless of whether soldering or another bonding technique employed, the solder mask 22 protects the printed circuitry 20 from abrasion or other physical damage. Since the light emitting apparatus 8 employs on top of the solder mask 22 the highly reflective layer 26, which will be described in more detail below, the solder mask 22 that is employed in the depicted embodiment can be a conventional blue or green epoxy solder mask. The solder mask 22 can have a reflectance level less than about 80%, and even less than 60%, for visible light. This results in a cost savings as compared to light emitting apparati that employ white solder masks, and especially as compared to using a white solder mask that includes the filler materials described above.

To maximize light extraction efficiency, the reflective layer 26 is constructed to have a reflectance of greater than about 90%, and preferably greater than about 95%, in the spectrum of visible light, i.e. at least between about 400 nanometers to about 700 nanometers. The reflective layer 26 also can have a reflectance of greater than about 90%, and preferably greater than about 95%, at least between about 400 nanometers to about 470 nanometers. Light, including blue and violet light, and ultraviolet light emitted by the light emitting chips 10 which directly impinges upon the reflective layer 26 (or which reflects off the sidewalls 38, 40 and/or the plate 50 and then impinges upon the reflective layer 26) is substantially reflected toward the plate 50, which can contribute to generation of phosphorescence or fluorescence when a phosphor plate is employed. In a light emitting apparatus that does not employ a phosphor plate, the light is still directed out of the housing as opposed to being absorbed into the printed circuit board. The highly reflective layer 26 can be applied on top of the solder mask 22 and can continue so that it is also applied on the reflective interior surfaces 46 of the housing.

The reflective layer 26 can be made from a reflective film having a uniform thickness, such as the reflective film described in U.S. Pat. No. 5,838,406. The film can be made from an expanded polytetrafluoroethylene (PTFE), such as that made in accordance with U.S. Pat. Nos. 3,953,566, 3,962, 153, 4,096,227, 4,187,390, and 4,902,423. This expanded PTFE material includes a microporous structure of microscopic polymeric fibrils (i.e., thread-like elements) interconnecting polymeric nodes (i.e., particles from which fibrils emerge). This material includes polymeric nodes and fibrils extending from the nodes. Voids are provided within the material.

The reflective layer 26 can be granular PTFE that is adhered or otherwise affixed to the solder layer 22. The reflective layer can also affix to the insulating material of the printed circuit board, obviating the need for the solder mask layer 22. When applied as a granular material or as a film, the reflective layer generally follows the contour of the layer (solder mask of insulating material) to which the reflective layer is affixed. This is schematically depicted in the figures. When being applied as a film, the reflective film can be cut to provide the openings 28 for the electrical connection of the chips 10. Each opening 28 can be large enough to receive a chip 10, which would allow the placement of the reflective film after the chips 10 have been placed on the printed circuit board 12. Alternatively, each opening 10 can be smaller than the area of the chip 10 to only provide enough room for electrical connections of the bonding pads 64.

In one embodiment, the light emitting package 8 produces visible light through wavelength conversion by the plate 50. In other contemplated embodiments, the light emitting package is a light source that emits the direct light produced by the light emitting chips. In these embodiments, optics, sidewalls, lenses, cover glasses, or so forth will generally reflect or otherwise redirect some of the direct light toward the reflective layer found on the printed circuit board.

The invention has been described with reference to the preferred embodiments. Obviously, modifications and alterations will occur to others upon reading and understanding the preceding detailed description. It is intended that the invention be construed as including all such modifications and alterations insofar as they come within the scope of the appended claims or the equivalents thereof.

The invention claimed is:

1. A light emitting apparatus comprising:
   one or more light emitting chips;
   a printed circuit board on which the one or more light emitting chips are disposed, the printed circuit board including an electrically insulating board, electrically conductive printed circuitry, and an electrically insulating solder mask having vias through which the one or more light emitting chips electrically contact the printed circuitry, wherein the solder mask has a reflectance level less than about 80% for visible light; and
   a reflective film on the solder mask, the reflective film including polytetrafluoroethylene (PTFE) and having openings that align with respective vias in the solder mask through which the one or more light emitting chips electrically contact the printed circuitry, the reflective film having a reflectance of greater than about 90% at least between about 400 nanometers to about 750 nanometers.

2. The apparatus of claim 1, wherein the solder mask comprises a solder mask layer overlaying the electrically conductive printed circuitry and disposed beneath the reflective film.

3. The apparatus of claim 2, wherein the reflective film adheres to the solder mask layer and is of a generally uniform thickness.

4. The apparatus of claim 3, wherein the reflective film generally follows the contour of the solder mask layer.

5. The apparatus of claim 1, wherein the reflective film includes granular PTFE.

6. The apparatus of claim 1, wherein the reflective film is a PTFE film having openings that each receive a respective chip.

7. The apparatus of claim 1, further comprising an optical component disposed in relation to the printed circuit board and the one or more light emitting chips such that when the one or more light emitting chips is energized and emits light, light reflects from the optical component back towards the reflective film on the printed circuit board.

8. The apparatus of claim 7, wherein the optical component includes a reflective surface and a light transmissive surface, wherein the optical component is configured to diffuse light that passes through the light transmissive surface.

9. The apparatus of claim 8, wherein the reflective surface is at least partially covered by the reflective film.

10. The apparatus of claim 7, wherein the optical component includes a phosphor arranged to be irradiated by the one or more light emitting chips to emit light in a wavelength range predominantly above 470 nanometers responsive to the irradiating.

11. The apparatus of claim 10, wherein the phosphor and the one or more light emitting chips are relatively arranged such that at least some of the light emitted by the one or more light emitting chips predominantly in the wavelength range between about 400 nanometers and about 470 nanometers reflects from the phosphor onto the reflective film of the printed circuit board.

12. The apparatus of claim 1, wherein the one or more light emitting chips includes a first chip that emits light of a first color and a second chip that emits light of a second color.

13. The apparatus of claim 1, further comprising a housing inside of which the one or more light emitting chips and the printed circuit board are disposed, the housing including a phosphor arranged to be irradiated by the one or more light emitting chips and emitting light in a wavelength range predominantly above 470 nanometers responsive to the irradiating, the phosphor and the printed circuit board being relatively arranged such that at least some of the light emitted by the one or more light emitting chips predominantly in the wavelength range between about 400 nanometers and about 470 nanometers reflects from the phosphor onto reflective film on the printed circuit board.

14. A method for fabricating a light emitting apparatus, the method comprising:
   providing an electrically insulating board with electrically conductive printed circuitry disposed thereon;
   disposing an electrically insulating solder mask on the electrically insulating board leaving exposed at least a portion of the printed circuitry;
   disposing one or more light emitting chips on the insulating solder mask, the one or more light emitting chips electrically contacting the exposed printed circuitry; and
   disposing a reflective layer on the insulating solder mask around the one or more light emitting chips, the reflective layer including polytetrafluoroethylene (PTFE) and having a reflectance of greater than about 90% at least between about 400 nanometers and about 470 nanometers.

15. The method of claim 14, further comprising:
   providing an optical component disposed in relation to the board and the one or more chips such that when the one or more chips is/are energized to emit light, light is reflected by the optical component back towards the reflective layer.

16. The method of claim 15, wherein the reflective layer comprises PTFE and the solder mask has a reflectance below 60% for wavelengths less than about 410 nanometers.

* * * * *